(12) United States Patent
Eagle et al.

(10) Patent No.: US 7,488,192 B1
(45) Date of Patent: Feb. 10, 2009

(54) APPARATUS AND METHOD THAT MINIMIZING DIMENSIONAL INSTABILITY AND SOLDER STRESS IN SURFACE MOUNTED INTERCONNECTIONS

(75) Inventors: Jason R. Eagle, Kasson, MN (US); Joseph P. Kuczynski, Rochester, MN (US); Christopher M. Marroquin, Rochester, MN (US); Amanda E. Mikhail, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/972,168

(22) Filed: Jan. 10, 2008

(51) Int. Cl.
*H01R 13/62* (2006.01)
(52) U.S. Cl. .................................................... 439/159
(58) Field of Classification Search ................ 439/157, 439/159

See application file for complete search history.

(56) References Cited

U.S. PATENT DOCUMENTS

| | | | | |
|---|---|---|---|---|
| 4,586,254 A | * | 5/1986 | Ammon et al. | 29/884 |
| 6,431,889 B1 | * | 8/2002 | Olson | 439/157 |
| 6,524,116 B2 | * | 2/2003 | Davison et al. | 439/70 |
| 7,303,443 B1 | * | 12/2007 | Beaman et al. | 439/637 |

* cited by examiner

*Primary Examiner*—Truc T Nguyen
(74) *Attorney, Agent, or Firm*—Cantor Colburn LLP

(57) ABSTRACT

A surface mounted apparatus for use with electrical component interconnections including a planar surface, a slide disposed proximate to the planar surface and being made of a material having a coefficient of thermal expansion (CTE) that is substantially matched to that of a material of the planar surface, the slide being further configured to accommodate solderable contact elements stitched therethrough and soldered to the planar surface, a connector body to support the slide in a cavity defined therein, the cavity being sufficiently large to allow the slide to float in accordance with thermal expansions and contractions of the slide and the planar surface, which respectively occur during solder reflow and subsequent cool-down of the connector assembly.

16 Claims, 4 Drawing Sheets

APPARATUS AND METHOD THAT MINIMIZING DIMENSIONAL INSTABILITY AND SOLDER STRESS IN SURFACE MOUNTED INTERCONNECTIONS

BACKGROUND OF THE INVENTION

1. Field of the Invention

Aspects of the present invention are directed to surface mounted interconnections and, more particularly, to surface mounted interconnections that minimize dimensional instability and solder stress.

2. Description of the Background

Generally, conventional dual in-line memory module (DIMM) interconnections employing surface mounted technology (SMT) have a connector housing (connector) molded with liquid crystal polymers (LCPs). In these interconnections, contacts are inserted and/or stitched into the connector and subsequently retained by the connector geometry before being simultaneously soldered to a print circuit board (PCB) to which the DIMM is connected.

However, it has been observed that molded LCPs are dimensionally unstable in the directions of the thermal expansion and contraction of the PCB. In detail, the soldering operation heats the PCB and the connector. Subsequently, since the PCB and the connector have mismatched coefficients of thermal expansion (CTEs), the PCB and the connector experience mismatched thermal expansions during the reflow operation, and then mismatched contraction when the PCB and the connector cool. The critical period is when the assembled connector system cools through the solder solidus, when the connector-to-PCB interface is locked into position. Further cooling to room temperature at different rates causes stresses to build up at the solder joint. In addition, it has been observed that molded LCPs also demonstrate final dimensional instability. After the expansion and contraction during the heating and cooling cycle, the connectors have demonstrated a permanent size change. This also contributes to increased stress at the solder joint.

It has further been observed that the resulting mismatched thermal expansions and contractions generate dimensional instability and stresses between the PCB and the contacts of the connector. Such instabilities and stresses may be manifested in a warped and/or similarly affected PCB and/or an altered position of mating contacts within the connector that increase manufacturing costs and risks of failure of the conventional interconnections at both the separable interface and the connector-to-PCB interface.

One solution to these problems has been to anneal the connector. However, it has been seen that this solution has its own drawbacks. Namely, annealing can cause the connector to twist or bow. Further, if a connector's contacts are stitched prior to the annealing process the high annealing temperature can cause base metal migration in the contacts and leads. Base metal migration interferes with the overall contact resistance of the interface in that it introduces the likelihood of oxide formation (e.g., Nickel oxide, copper oxide) over the gold mating interface, increasing contact resistance, and decreasing contact integrity

SUMMARY OF THE INVENTION

In accordance with an aspect of the invention, a surface mounted apparatus for use with electrical component interconnections is provided and includes a planar surface, a slide disposed proximate to the planar surface and being made of a material having a coefficient of thermal expansion (CTE) that is substantially matched to that of a material of the planar surface, the slide being further configured to accommodate solder elements stitched therethrough and soldered to the planar surface, a connector body to support the slide in a cavity defined therein, the cavity being sufficiently large to allow the slide to float in accordance with thermal expansions and contractions of the slide and the planar surface, which respectively occur during soldering and a subsequent reflow of the solder elements.

In accordance with another aspect of the invention, a surface mounted apparatus for use with electrical component interconnections is provided and includes a planar surface including solder pads arrayed thereon, the solder pads being configured to accommodate solder elements soldered thereto, a slide, through which the solder elements are stitched, disposed proximate to the planar surface and including a material having a characteristic coefficient of thermal expansion, which is selected such that a thermal expansion and contraction of the slide substantially matches those of the planar surface during the soldering and a subsequent reflow, and a connector body to support the slide in a cavity defined therein, the cavity being sufficiently large to allow the slide to float in accordance with the thermal expansions and contractions.

In accordance with still another aspect of the invention, a method of assembling an apparatus including a connector of a planar surface is provided and includes forming a set of solder elements, molding the connector and manufacturing a slide from a material having a coefficient of thermal expansion that matches that of the planar surface, stitching the solder elements into the connector, and installing the slide and the solder elements in the connector.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTIONS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION OF THE INVENTION

Figure 1:
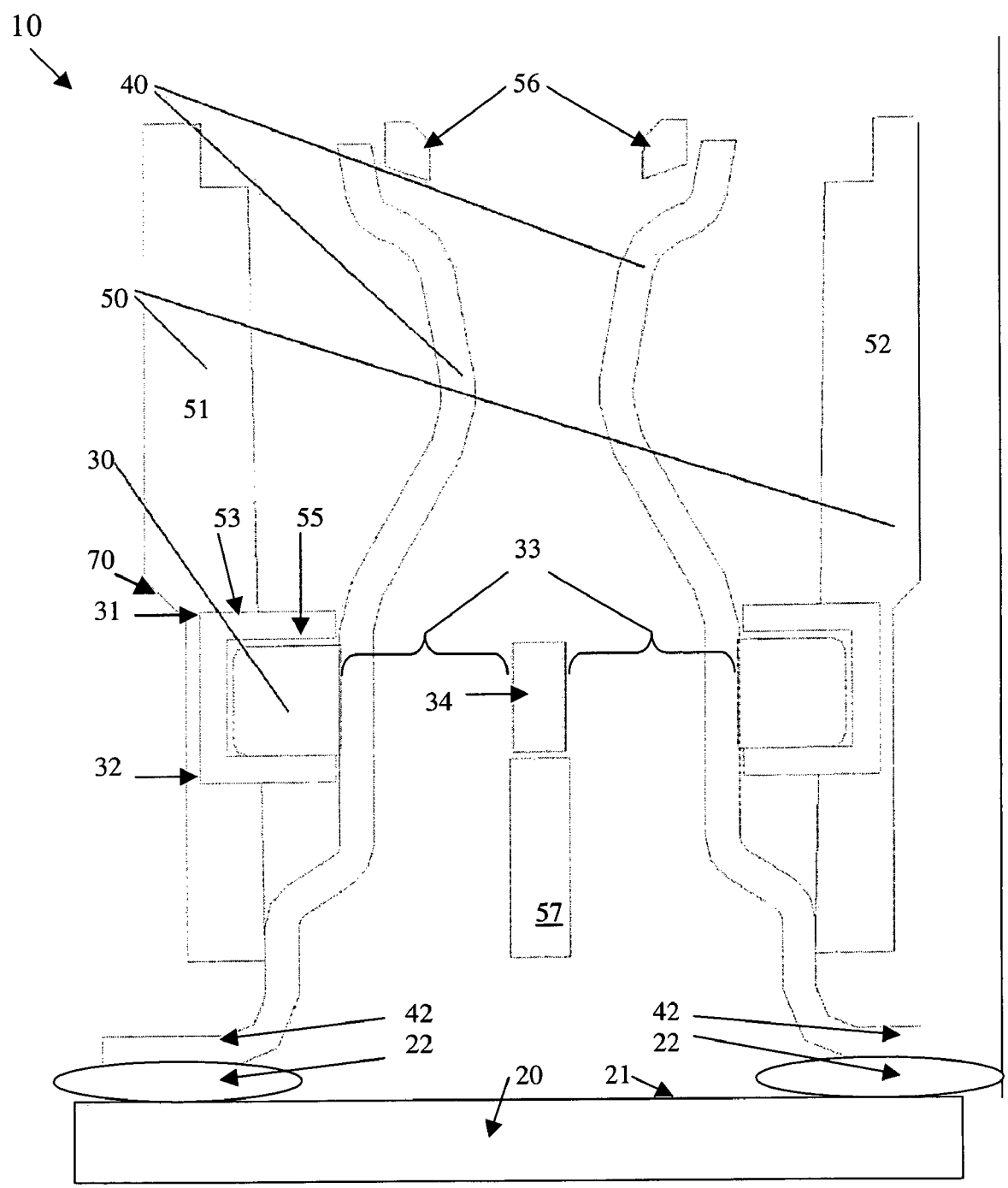
FIG. 1 is a cross-sectional view of a surface mounted apparatus in accordance with an exemplary embodiment of the invention.

With reference to FIG. 1, as shown, an exemplary embodiment of a surface mounted apparatus 10 includes a planar surface 20, a slide 30 disposed proximate to the planar surface 20 and being made of a material having a coefficient of thermal expansion (CTE) that is substantially matched to that of a material of the planar surface 20, solder elements 40 to be stitched through the slide 30 and soldered to the planar surface 20, and a connector body 50 to support the slide 30 in a cavity 55 defined therein. The cavity 55 is sufficiently large to allow the slide 30 to float in accordance with thermal expansions and contractions of the planar surface 20 and the slide 30. Here, it is understood that the thermal expansions and contractions of the planar surface 20 and the slide 30 respectively occur due to the soldering, during which these features are heated to produce adequate reflow of solder paste, and then cool-down, during which these features are cooled.

The floating of the slide 30 accounts for a change in the dimensions of both the planar surface 20 and slide 30 during the thermal expansions and contractions of these features. Since the slide 30 is able to float within the cavity 55, the slide 30 is provided with room to thermally expand and contract along with the planar surface 20. As such, dimensional instability relative to the planar surface 20 and other stresses that may otherwise be generated on the planar surface 20 and/or the solder elements 40 are prevented and/or substantially reduced.

In an embodiment of the invention, the reduction of relative dimensional instability and stress is particularly achieved by the matching of the thermal expansions and contractions of the planar surface 20 and the slide 30. Where there is expected to be little or no temperature gradient between the planar surface 20 and the slide 30, the matching of the thermal expansions and contractions is accomplished by the selection of materials for the planar surface 20 and the slide 30 that have matching coefficients of thermal expansion (CTE). According to this solution, as the temperature of the planar surface 20 and the slide 30 increase (e.g., during the pre-heat and solder reflow), the planar surface 20 and the slide 30 thermally expand at substantially similar rates. Similarly, when the planar surface 20 and the slide 30 cool back to room temperature, the planar surface 20 and the slide 30 contract at substantially similar rates.

Conversely, where there is expected to be a non-trivial temperature gradient between the planar surface 20 and the slide 30, the matching of the thermal expansions and contractions are accomplished by a selection of materials for the planar surface 20 and the slide 30 having slightly mismatched CTEs while taking the temperature gradient into account. Here, the slight mismatch of the CTEs accounts for the presence of the temperature gradient such that the resulting thermal expansions and contractions of the planar surface 20 and the slide 30 are substantially similar to one another.

According to exemplary embodiments of the invention, the planar surface 20 comprises a printed circuit board (PCB), which may comprise a material including at least one of brominated bisphenol A-based epoxy resin cured with dicyandiamide (DICY), brominated bisphenol A-based epoxy resin cured with phenolic compounds, cyanate ester/epoxy blends, polyphenylene oxide (PPO)/triallylisocyanurate (TAIC) blends and/or blends thereof. Of course, it is understood that other materials having similar properties may be employed.

The slide 30, which has been described as being made of flame retardant material, may also comprise the same or similar materials as the PCB or, more generally, the planar surface 20. Of course, it is understood that the planar surface 20 and the slide need not comprise the same or similar material as long as the respective thermal expansions and contractions of each are substantially similar under similar conditions.

The material of the connector body 50 may comprise a molded liquid crystal polymer (LCP), polyphenylene sulfide (PPS), polybutylene terephthalate (PBT), nylon 66, other similar materials and/or blends thereof. In any case, the connector body 50 should have a relatively high melting point (e.g., above 300 degrees Celsius), a relatively low CTE, and relatively high flame retardancy (e.g., UL 94 V0, or better).

Still referring to FIG. 1, it is noted that each of the solder elements 40 are soldered to solder pads 22 arranged on a face 21 of the planar surface 20, that each of the solder pads 22 comprises, e.g., copper or another similar conductor, and that each of the solder elements 40 comprises an electrical lead 42 to be electrically coupled to each of the solder pads 22. To this end, each of the solder pads 22 may comprise a solder fillet to act as a solder paste that may extend up to about 15% of a height of the corresponding electrical lead.

The shape of the solder elements 40 may be generated by a stamping process used in their formation. While an embodiment of this shape is illustrated in FIG. 1, in which the solder elements 40 include a pad portion and a substantially vertical portion, this embodiment is not required and may be modified as necessary as long as the solder elements 40 can be stitched through the slide 30 such that they are positioned properly within the connector body 50 and as long the slide 30 provides the solder elements 40 with stability in the plane of the slide 30.

Figure 2:
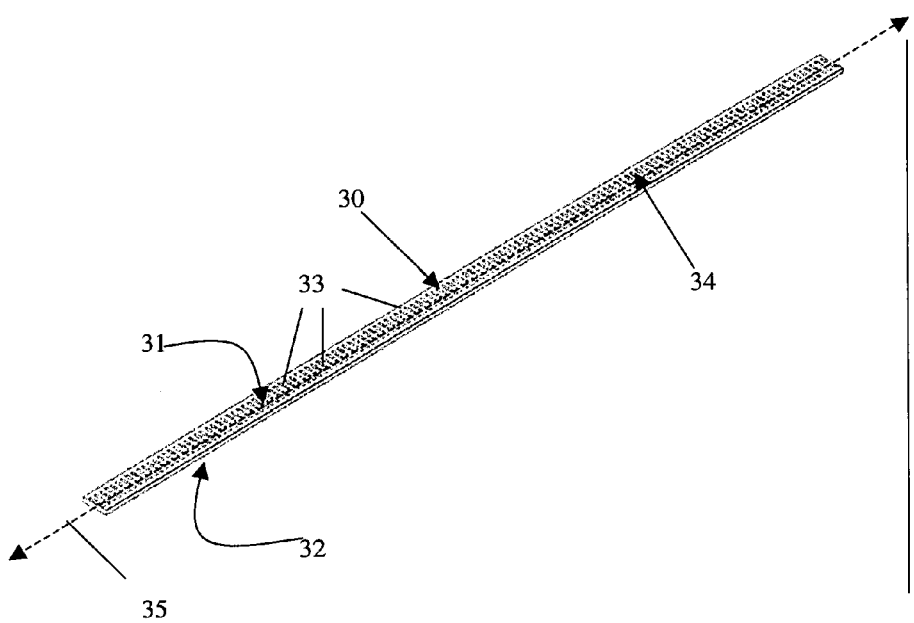
FIG. 2 is a perspective view of a slide in accordance with an exemplary embodiment of the invention.

With reference now to FIGS. 1 and 2, it is further noted that the solder pads 22 are arranged on the face 21 of the planar surface 20 in two side-by-side columns and that the slide 30 is shaped accordingly. That is, the slide 30 is sufficiently long and wide such that each solder pad 22 generally corresponds to a portion of the face of the slide 30 that faces the planar surface 20. Of course, it is understood that other arrangements of the solder pads 22 are possible and that the shape of the slide 30 may be modified accordingly.

Where the solder pads 22 are provided in the two-column format, in greater detail as shown in FIG. 2, the slide 30 includes a first face 31 and a second face 32. The second face 32 faces the surface 21 of the planar surface 20 on which the solder pads 22 are arranged and the first face 31 faces away from the planar surface 20 in opposition to the second face 32. A set of apertures 33 are defined in the slide 30 and extend from the first face 31 to the second face 32 to thereby allow the solder elements 40 to be stitched through the slide 30. In this manner, the apertures 33 stably hold the solder elements 40 in the direction 35 of the slide 30 during the solder reflow process and subsequent cool-down.

During the solder reflow process and subsequent cool-down, the planar surface 20 and the slide 30 thermally expand and contract along, at least, a direction that is substantially parallel to a longitudinal axis 35 of the slide 30 in accordance with their respective CTEs. The slide 30 further includes a central rib 34, which is disposed in a central region of the slide 30 to extend along the longitudinal axis 35 thereof. The central rib 34 is bounded on outer portions thereof by the apertures 33.

Figure 3:
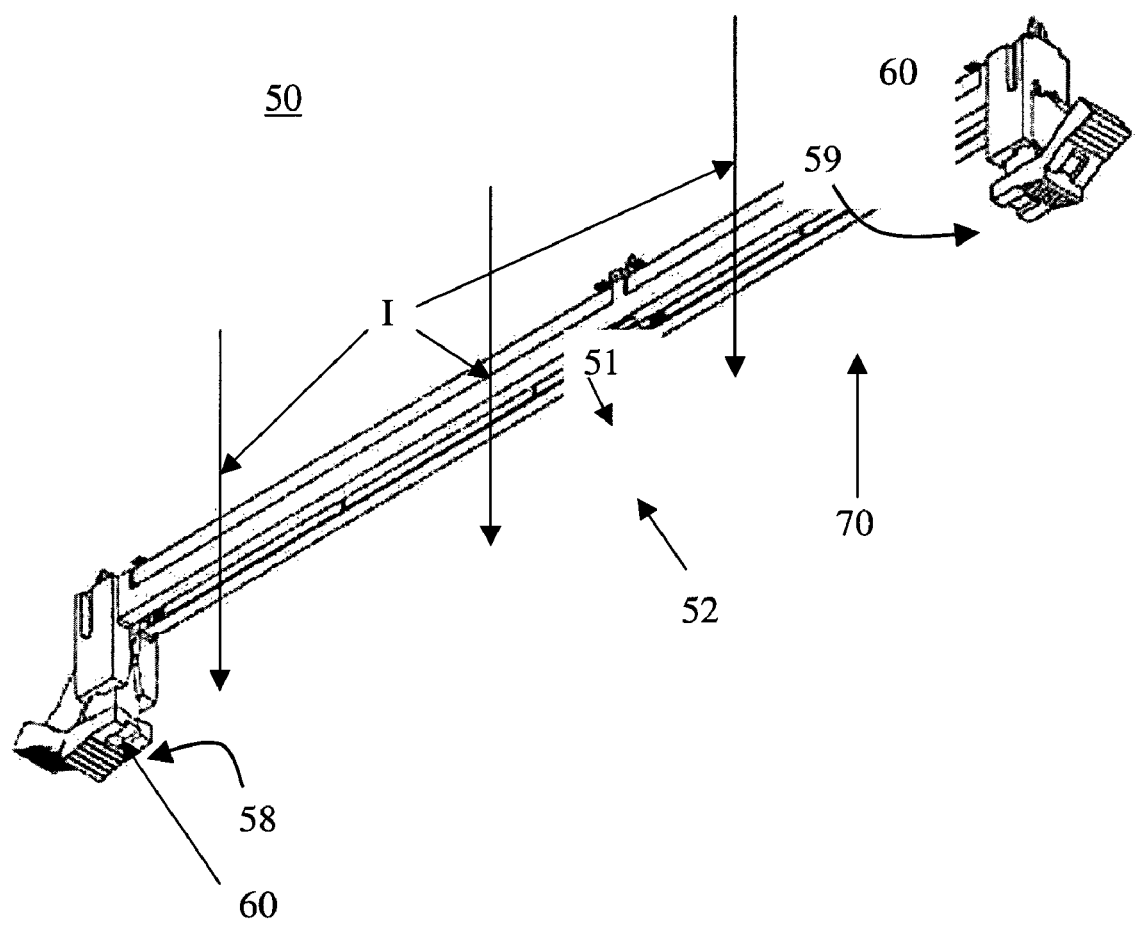
FIG. 3 is a perspective view of an exterior of a connector body in accordance with an exemplary embodiment of the invention.

With reference now to FIGS. 1 and 3, the connector body 50 includes first and second opposing walls 51 and 52 into which a sleeve 53 is integrally built. The cavity 55 is defined within the sleeve 53. A pair of biasing members 56 is disposed between the first and second opposing walls 51 and 52 to bias ends of the solder elements 30 into fixed positions relative to the plane of the slide 30. A central portion 57, on which the central rib 34 of the slide 30 is supported, is also disposed between the first and second opposing walls 51 and 52 but at a lower region (i.e., closer to the planar surface 20) than the biasing members 56. First and second enclosures 58 and 59 are disposed at opposite ends of the first and second opposing walls 51 and 52 to support the biasing members 56 and the central portion 57. With this construction, it may be understood that the connector body 50 includes guidance and retention features that may be applied to, at least, the solder elements 30.

Still referring to FIG. 3, in accordance with an embodiment of the invention, the connector body may further comprise locking units 60 disposed at the opposite ends of the first and second walls 51 and 52. The locking units 60 may be employed to lock or to assist in locking an electronic component card, such as a dual in-line memory module (DIMM), into a fixed position relative to the fixed positions of the ends of the solder elements 30. The locking is shown schematically, in FIG. 3, by arrows I, which indicate a direction of card insertion into the connector body 50.

As an additional feature, exterior surfaces of the first and second opposing walls 51 and 52 of the connector body 50 may each comprise a stepped structure 70. The stepped structure 70 increases a characteristic elasticity of the first and second opposing walls 51 and 52 and also provides additional structural support for the apparatus 10 as a whole.

With reference to FIGS. 1-3, in accordance with another exemplary embodiment of the invention, a surface mounted apparatus 10 includes a planar surface 20, including solder pads 22 arrayed thereon. Solder elements 40 are to be soldered to the solder pads 22. A slide 30, through which the solder elements 40 are stitched, is disposed proximate to the planar surface 20 and includes a material having a characteristic coefficient of thermal expansion (CTE), which is selected to insure that thermal expansion and contraction of the slide occurs in accordance with that of the planar surface 20 during the soldering and a subsequent reflow. A connector body 50 supports the slide 30 in a cavity 55 defined therein. The cavity 55 is sufficiently large to allow the slide 30 to float in accordance with the thermal expansion and contraction of the planar surface 20 and the slide 30.

As above, in this embodiment the slide 30 and the planar surface 20 thermally expand and contract as their respective temperatures increase and decrease, respectively, at substantially similar rates and in substantially similar directions. As such, relative dimensional instabilities and stresses that may otherwise be generated during the solder reflow and subsequent cool-down are prevented or substantially reduced.

Again, it is understood that where a temperature gradient between the planar surface 20 and the slide 30 is minimal, the respective CTEs of the materials used for each feature may be substantially matched to one another. Conversely, where a non-trivial temperature gradient exists between the planar surface 20 and the slide 30, the materials used for each can be selected so as to have appropriately mismatched CTEs to thereby account for the presence of the temperature gradient.

Figure 4:
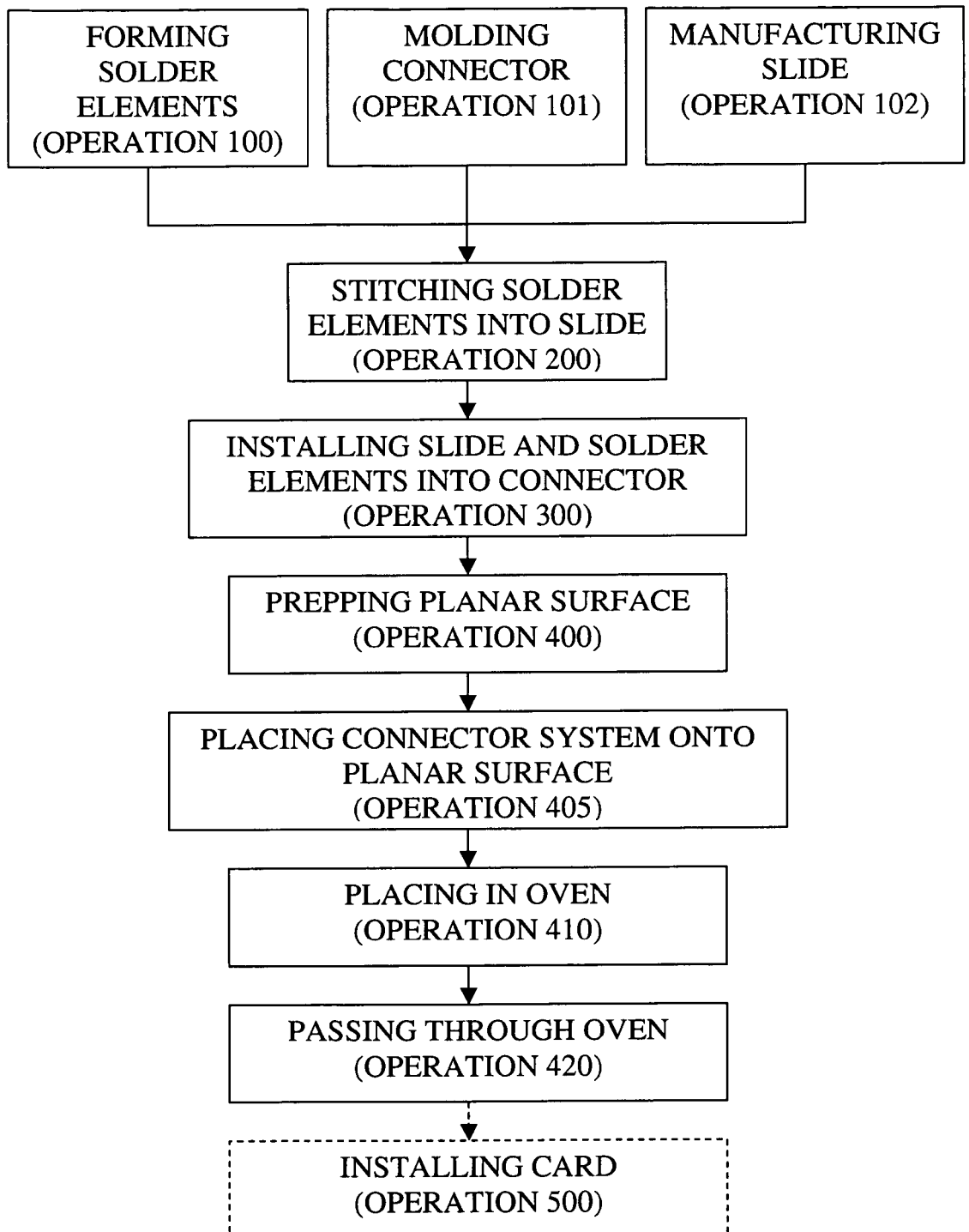
FIG. 4 is a flowchart to diagram a method of assembling a surface mounted apparatus in accordance with an exemplary embodiment of the present invention.

With reference to FIG. 4, in accordance with another exemplary embodiment of the invention, a method of assembling an apparatus including a connector body of a planar surface 20 includes forming a set of solder elements 40, molding the connector body 50 and manufacturing a slide 30 from a material having a coefficient of thermal expansion that matches that of the planar surface 20 (operations 100, 101 and 102, respectively), stitching the solder elements 40 into the slide 30 (operation 200), and installing the slide 30 along with the solder elements 40 in the connector body 50 (operation 300).

Here, it is noted that operations 100, 101 and 102 may be conducted in any order or simultaneously, as they are independent from one another. Further, in the conducting of operations 100, 101 and 102, the planar surface 20, the slide 30, the solder elements 40 and the connector body 50 may be made of various materials in accordance with the descriptions given above.

With respect to the formation of the solder elements in operation 100, it is noted that these features may be formed by, e.g., a stamping operation or other similar manufacturing techniques. In operations 101 and 102, the manufacturing of the slide 30 and the molding of the connector body 50 may be accomplished by, e.g., injection molding or, again, other similar manufacturing techniques. The planar surface 20 may be produced by PCB manufacturing techniques known in the industry.

Still referring to FIG. 4, the method further comprises prepping the planar surface 20 for a soldering operation (operation 400), placing the connector body 50, including the slide 30 and the solder elements 40, onto the prepped planar surface 20 to form a non-reflowed assembly (operation 405), placing the non-reflowed assembly into oven (operation 410) and passing the non-reflowed assembly through a reflow oven (operation 420).

In the prepping of the planar surface 20 (operation 400), solder paste is applied to solder pads 22, comprising, e.g., copper (Cu) or another similar conductor, which are arrayed on the planar surface 20, as described above. It follows then that the operation of placing the connector body 50, including the slide 30 and the solder elements 40, onto the prepped planar surface 20 involves positioning the solder elements 40 such that each solder element 40 respectively contacts a corresponding solder pad 22.

The reflow oven to be used to solder the solder elements 40 to the solder pads 22 may comprise a vapor phase oven, an IR convection oven or another similar type of oven. Inside the oven, the assembly undergoes the soldering operation during which the features are substantially simultaneously heated from about 25 degrees Celsius to about 265 degrees Celsius. Subsequently, the features are allowed to cool.

It is during the cooling process that dimensional instability and/or stresses would otherwise occur if not for the substantial matching of the CTEs of the materials of the planar surface 20 and the slide 30, which, as discussed above, allows the planar surface 20 and the slide 30 to thermally expand and contract in accordance with one another.

Subsequently, it is understood that the soldered and reflowed assembly forms the apparatus. At this point, once the apparatus is sufficiently cooled, in an embodiment of the invention, the method may further comprise installing an electronic component card, such as a dual in-line memory module (DIMM) onto the connector body 50 of the apparatus (operation 500).

In accordance with still further embodiments of the invention, it is noted that the method described above may be carried out by a machine and/or computer having executable machine and/or computer readable instructions stored thereon that instruct the machine and/or the computer to operate.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

We claim:

1. A surface mounted apparatus for use with electrical component interconnections, comprising:
   a planar surface;
   a slide disposed proximate to the planar surface and being made of a material having a coefficient of thermal expansion (CTE) that is substantially matched to that of a material of the planar surface, the slide being further configured to accommodate solder elements stitched therethrough and soldered to the planar surface;
   a connector body to support the slide in a cavity defined therein, the cavity being sufficiently large to allow the slide to float in accordance with thermal expansions and contractions of the slide and the planar surface, which respectively occur during soldering and a subsequent reflow of the solder elements.

2. The surface mounted apparatus according to claim 1, wherein, where the CTEs of the materials of the planar surface and the slide are not precisely matched, a selection of the materials of the planar surface and the slide is based on matching rates of the thermal expansions and contractions of the slide and those of the planar surface at respective local temperatures of the slide and the planar surface.

3. The surface mounted apparatus according to claim 1, wherein the planar surface comprises a printed circuit board (PCB).

4. The surface mounted apparatus according to claim 1, wherein the slide and the planar surface each comprise materials that thermally expand and contract without otherwise failing as the materials are heated from about 25 degrees Celsius to about 265 degree Celsius during the soldering and the subsequent reflow.

5. The surface mounted apparatus according to claim 1, wherein the solder elements are soldered to solder pads comprising copper, and
   wherein each of the solder elements comprises an electrical lead to be electrically coupled to each of the solder pads.

6. The surface mounted apparatus according to claim 1, wherein the slide and the planar surface thermally expand and contract in directions that are substantially parallel to, at least, a longitudinal axis of the slide.

7. The surface mounted apparatus according to claim 1, wherein the slide comprises a central rib which is disposed in a central region of the slide and which extends along a longitudinal axis thereof, and
   wherein the solder elements are stitched through apertures extending from a face of the slide facing the planar surface to an opposite face thereof.

8. The surface mounted apparatus according to claim 1, wherein the connector body comprises a liquid crystal polymer (LCP) surface mount technology (SMT) for use with a dual in-line memory module (DIMM).

9. The surface mounted apparatus according to claim 3, wherein the PCB comprises a material including at least one of brominated bisphenol A-based epoxy resin cured with dicyandiamide (DICY), brominated bisphenol A-based epoxy resin cured with phenolic compounds, cyanate ester/epoxy blends, polyphenylene oxide (PPO)/triallylisocyanurate (TAIC) blends, and/or blends thereof.

10. The surface mounted apparatus according to claim 9, wherein the connector body comprises a molded liquid crystal polymer (LCP).

11. The surface mounted apparatus according to claim 5, wherein each of the solder pads comprises a solder fillet that extends up to about 15% of a height of the corresponding electrical lead.

12. The surface mounted apparatus according to claim 5, wherein the solder pads are arrayed on the primary face of the planar surface in two columns, and
    wherein the slide is shaped to correspond to dimensions of the two column array of solder pads.

13. The surface mounted apparatus according to claim 7, wherein the connector body comprises:
    first and second opposing walls forming a sleeve therebetween in which the cavity is defined;
    a pair of biasing members disposed between the first and second walls to bias ends of the solder elements into fixed positions;
    a central portion on which the central rib of the slide is supported; and
    first and second enclosures at opposite ends of the first and second opposing walls to support the biasing members and the central portion.

14. The surface mounted apparatus according to claim 13, wherein the connector body further comprises locking units disposed at the opposite ends of the first and second walls to lock an electronic component card into a fixed position relative to the positions of the solder elements.

15. The surface mounted apparatus according to claim 14, wherein exterior surfaces of the first and second opposing walls of the connector body each comprise a stepped structure to increase a characteristic elasticity thereof.

16. A surface mounted apparatus for use with electrical component interconnections, comprising:
    a planar surface including solder pads arrayed thereon, the solder pads being configured to accommodate solder elements soldered thereto;
    a slide, through which the solder elements are stitched, disposed proximate to the planar surface and including a material having a characteristic coefficient of thermal expansion, which is selected such that a thermal expansion and contraction of the slide substantially matches those of the planar surface during the soldering and a subsequent reflow; and
    a connector body to support the slide in a cavity defined therein, the cavity being sufficiently large to allow the slide to float in accordance with the thermal expansions and contractions.

* * * * *